United States Patent [19]

Perkins

[11] Patent Number: 5,747,189
[45] Date of Patent: May 5, 1998

[54] SMART BATTERY

[75] Inventor: Bradley Alan Perkins, Mountain View, Calif.

[73] Assignee: Valence Technology, Inc., Henderson, Nev.

[21] Appl. No.: 918,435

[22] Filed: Jul. 22, 1992

[51] Int. Cl.$^6$ .......................................... H02J 7/00
[52] U.S. Cl. ..................... 429/91; 429/7; 429/61; 429/92
[58] Field of Search .................... 320/39, 48; 429/7, 429/61, 91, 92

[56] References Cited

U.S. PATENT DOCUMENTS

| | | | |
|---|---|---|---|
| 3,718,848 | 2/1973 | Hines | 320/7 |
| 3,728,599 | 4/1973 | Minami | 318/139 |
| 3,855,534 | 12/1974 | Holcomb et al. | 325/118 |
| 3,886,426 | 5/1975 | Daggett | 320/7 |
| 4,111,274 | 9/1978 | King et al. | 180/25 |
| 4,289,836 | 9/1981 | Lemelson | 429/61 |
| 4,447,712 | 5/1984 | Covillion | 219/486 |
| 4,583,035 | 4/1986 | Sloan | 320/39 |
| 4,583,036 | 4/1986 | Morishita et al. | 320/39 |
| 4,910,103 | 3/1990 | Yoshikawa et al. | 429/61 |
| 5,003,244 | 3/1991 | Davis | 320/17 |
| 5,193,067 | 3/1993 | Sato et al. | 320/39 |
| 5,206,097 | 4/1993 | Burn et al. | 429/7 |
| 5,237,263 | 8/1993 | Gannon | 323/288 |

*Primary Examiner*—Samuel Barts
*Attorney, Agent, or Firm*—Michael Ure

[57] ABSTRACT

A battery and circuitry for monitoring state of charge of the battery are housed in a single housing. A display may be provided for displaying an indication of the state of charge, and a communication circuit may be provided for communicating electrical signals representing the state of charge to the exterior of the housing. Preferably, the battery module additionally includes a switch device for connecting the battery to terminals external to the housing and control circuitry responsive to the monitoring circuitry for causing the battery to be connected to and disconnected from the terminals. The control circuitry operates in accordance with thresholds to prevent deep discharge and overcharge.

8 Claims, 2 Drawing Sheets

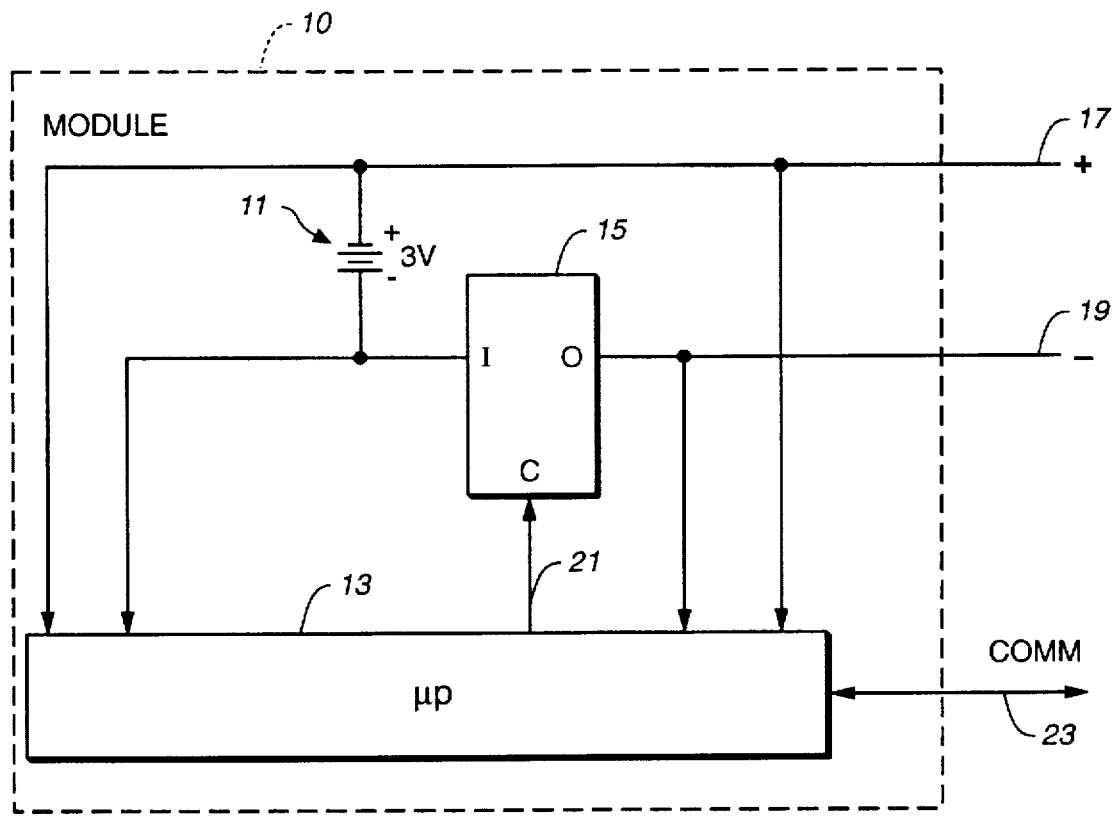
FIG._1
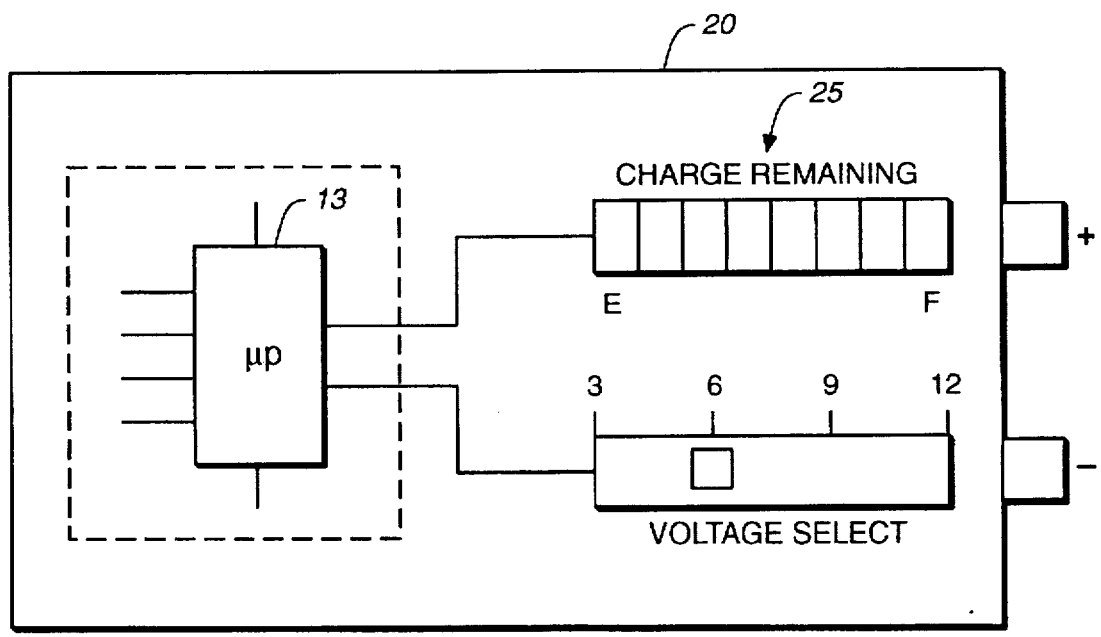
FIG._3

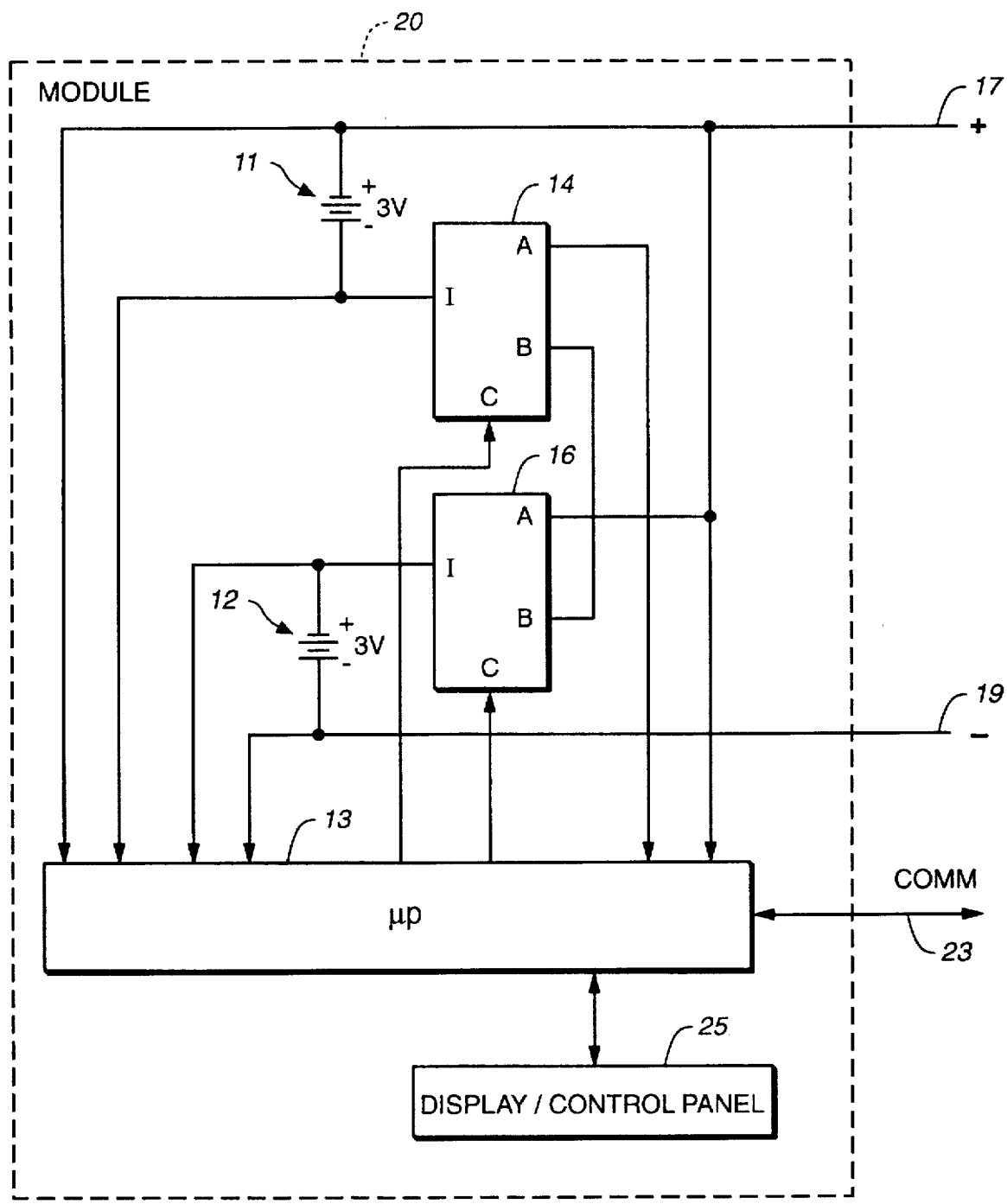
FIG._2

SMART BATTERY

BACKGROUND OF THE INVENTION

1. Field of the Invention

The present invention relates to battery management and more particularly to a smart battery having an intelligent controller built into a battery module and programmed to control the battery in accordance with in accordance with characteristics of batteries of the same type and characteristics of the particular battery.

2. State of the Art

Intelligent battery management is essential in order to maximize the useful life of a battery. In general, batteries are not indifferent to how the battery is discharged or recharged. For example, deep discharge causes the full-charge capacity of certain types of batteries (for instance, lithium polymer batteries) to decrease. In the case of other types of batteries (for example, nickel cadmium batteries), repeated light discharge is harmful to the battery. On the other hand, a particular recharge pattern may be beneficial to the battery and prolong the battery's useful life. Such recharge cycles may include periods of constant voltage, periods of constant current and resting periods during which no recharging is performed.

In the prior art, battery users have designed and implemented their own battery controllers. Such controllers may be relatively sophisticated in terms of the needs of the device in which the battery is incorporated, but are often less sophisticated in terms of battery management for maximizing battery performance. The detailed characteristics of the battery are generally not well-known or understood except by the maker of the battery. During battery development, exhaustive testing of prototype batteries is performed in which the batteries are cycles through numerous discharge and recharge cycles while voltage and current information is being recorded. At conclusion of such testing, the battery is well-characterized in terms of its performance characteristics and desirable discharge/recharge patterns. Although the maker of the battery may supply to the end user information characterizing the battery, for the user to understand and use such information to build an intelligent battery controller entails a considerable burden, one that the user often does not have sufficient incentive to undertake.

The smart battery of the present invention allows the intelligence of the designer of the battery, who is in a better position to design a battery control system than the designer of the device that will use the battery, to be incorporated into an intelligent battery module. The module remains programmable in order to accommodate user needs.

SUMMARY OF THE INVENTION

According to the present invention, a battery and circuitry for monitoring state of charge of the battery are housed in a single housing. A display may be provided for displaying an indication of the state of charge, and a communication circuit may be provided for communicating electrical signals representing the state of charge to the exterior of the housing. Preferably, the battery module additionally includes a switch device for connecting the battery to terminals external to the housing and control circuitry responsive to the monitoring circuitry for causing the battery to be connected to and disconnected from the terminals. The control circuitry operates in accordance with thresholds to prevent deep discharge and overcharge.

BRIEF DESCRIPTION OF THE DRAWINGS

The invention may be further understood from the following written description in conjunction with the appended drawings. In the drawings:

FIG. 1 is a block diagram of the battery module according to the present invention;

FIG. 2 is a block diagram of a modification of the battery module of FIG. 1; and FIG. 3 is a mainly perspective view of a battery module provided with a display/control panel.

DETAILED DESCRIPTION OF THE PREFERRED EMBODIMENTS

Referring now to FIG. 1, a smart battery module 10 includes, in addition to a battery 11, a logic device 13 such as a microprocessor and a switch 15 such as an opto-isolator. It should be understood that the logic device 13 may be any logic device including one formed from discrete components, and the switch 15 may be any type of switch including a relay, a mechanical switch, etc. For convenience of description, however, the logic device is assumed to be a microprocessor and the switch is assumed to be an opto-isolator. In the illustrated embodiment, the battery 11 is a three-volt battery and is connected to positive and negative battery terminals 17 and 19, respectively. The battery 11 may be a primary (non-rechargable) battery or a secondary (rechargable) battery. The microprocessor 13 may be produced in the form of an application-specific integrated circuit (ASIC) and is expected to cost at most a few dollars in volume quantities. The cost of the microprocessor makes the present invention most attractive for rechargable batteries.

The battery 11 is connected to the microprocessor 13 and is monitored by the microprocessor 13 in addition to supplying power thereto. Interposed between the battery and one of the terminals (in this instance, the negative terminal 19), is an opto-isolator 15, whereby a discharge or recharge path through the terminals 17 and 19 may be interrupted. An input terminal I of the opto-isolator 15 is connected to the battery 11, an output terminal O of the opto-isolator 15 is connected to the negative terminal 19, and a control terminal C of the opto-isolator 15 is connected to the microprocessor 13. According to a control signal 21 from the microprocessor 13, the opto-isolator 15 acts as either a closed switch or an open switch. Terminal monitoring leads are connected between the terminals 17 and 19 and the microprocessor 13 in order to monitor an applied recharge voltage. In addition, a communications bus 23 is connected to microprocessor 13 and enables communication with a user device. The communication bus 23 is preferably bi-directional and may be either parallel or serial.

The battery 11 will have associated with it a characteristic discharge voltage curve according to which the voltage across the battery decreases with increasing discharge. This curve may be stored in read-only memory (ROM) on-board the microprocessor 13. The microprocessor 13 is also provided with a suitable amount of RAM. The microprocessor 13 monitors the voltage across the battery 11 at regular intervals and records the voltage in RAM over time during a discharge cycle. If the actual discharge-voltage curve experienced by the battery is unexpectedly different than the expected discharge voltage curve, the microprocessor 13 may be alerted that an abnormal condition exists. In addition to monitoring voltage, the microprocessor 13 may also monitor discharge current, for example by monitoring the voltage across a known resistance inserted in the discharge path. The microprocessor 13 may also record voltage and current information over multiple discharge cycles. As the battery is repeatedly discharged and recharged, the energy storage capacity (energy density) of the battery typically decreases. A characteristic curve representing the energy density of the battery as a function of the number of cycles may also be stored in memory. If the actual energy density curve experienced by the battery over a number of cycles differs unexpectedly from the characteristic curve stored in memory, the microprocessor 13 may be alerted that an abnormality exists.

The microprocessor 13 as it monitors the voltage across the battery 11 is able to provide the using device, across communication bus 23, information as to the remaining charge in the battery. The remaining charge may be represented in appropriate units such as ampere-hours or milliampere-hours depending on the capacity of the battery 11. The remaining charge may also be represented in units of time remaining until full discharge at a current or average rate of discharge. Based on historical and preprogrammed data, the microprocessor may also project the remaining time at a projected rate provided by the using device.

The microprocessor 13 may also control the opto-isolator 15 to prevent discharge of the battery below a certain level, for example 20% of capacity. The level may be preset or may be dynamically set, either by the using device or by the microprocessor 13 according the battery's history.

In the case of battery packs containing multiple cells, the same microprocessor may control discharge and recharge of each battery. The microprocessor may also configure the output voltage of the battery pack by connecting cells in parallel or in series. Referring to FIG. 2, a battery module 20 includes a first cell 11 and a second cell 12. Each of the cells is assumed to be a three volt cell. The microprocessor 13 monitors the voltage across each of the cells 11 and 12. In addition, the microprocessor 13 monitors the voltage across the terminals 17 and 19.

Two-way opto-isolators 14 and 16 connect the cells 11 and 12 between the terminals 17 and 19 under the control of the microprocessor 13. The opto-isolators 14 and 16 each have an input terminal I, two output terminals including an A output terminal and a B output terminal, and a control terminal C. In the case of the opto-isolator 14, the I terminal is connected to the negative terminal of cell 11 and the A output terminal is connected to the negative terminal 19. In the case of the opto-isolator 16, the upper terminal I is connected to the positive terminal of cell 12 and the A output terminal is connected to the positive terminal 17. When the output terminal A of both the opto-isolators 14 and 16 is selected, the cells 11 and 12 are therefore connected in parallel between the positive terminal 17 and the negative terminal 19.

The B output terminals of the opto-isolators 14 and 16 are connected together. When the B output terminals are selected, the negative terminal of cell 11 is connected to the positive terminal of cell 12 such that the cells 11 and 12 are connected in series between the positive terminal 17 and the negative terminal 19, producing an output voltage of six volts. By presenting configuration commands to the microprocessor 13 across the communication bus 23, the using device may therefore configure the output voltage of the battery module. Although two battery cells are illustrated, any convenient number of cells may be provided. For example, the batteries of a battery module having four three volt cells may be configured to produce an output voltage of 3, 6, 9 or 12 volts.

The switches 14 and 16 instead of being two-way switches may be three-way switches with a third output terminal of each switch remaining unconnected, such that when a third output terminal is selected, the corresponding battery is disconnected. To prevent deep discharge, the microprocessor may shut down the entire module or may shut down the cells individually as they approach deep discharge. For example, if one of the cells has reached 20% of full charge while the other cell remains at 25% of full charge, the 20% cell may be shut down and the 25% cell used until the 25% cell reaches 20% of full charge. In this manner, battery life in multi-cell packs may be extended.

The foregoing discussion has focused primarily on discharge monitoring and control. The microprocessor 13 may also be used for recharge monitoring the control in the case of secondary batteries. By momentarily disconnecting the battery from a charging voltage applied to the terminals and monitoring the voltage across the battery, the current state of recharge may be determined. Also, the rate of recharge may be determined and a projection made of when the battery will be fully recharged. When the recharge voltage plateaus, the microprocessor may indicate to the using device that the battery has been fully recharged. By monitoring the voltage of the battery in its fully recharged state, the microprocessor may predict the number of cycles left in the battery using preprogrammed information.

By connecting or disconnecting a particular cell to or from the terminals 17 and 19, the cells of the module may be recharged all together, in groups, or singly. The recharge of each individual cell may be controlled so as to prevent overcharge of any individual cell. For example, if all of the cells are being recharged together, the cells may be disconnected from the terminals 17 and 19 as each cell reaches full charge. Recharge need not follow a set pattern but may be dynamically controlled based on instructions from the using device, from information as to how the current recharge cycle is progressing, or from historical information.

Furthermore, the method of recharge may be controlled by using linear switching devices having a conductance variable throughout a range instead of simple ON/OFF switches. An example of a linear switching device is an insulated gate field effect transistor (IGFET). Such a device allows full flexibility of recharging to be achieved. Recharge may be controlled based on current, or voltage, or current and voltage alternately. Furthermore, recharging may be interrupted at intervals to enforce rest periods in a manner that increases the life of certain types of batteries.

For ease of use, the battery module 20 of FIG. 2 is provided with a display/control panel 25. Configuration commands, rather than being input from a using device, may be input directly from the display/control panel 25. As seen in FIG. 3, rendered in partial cutaway, a control portion of the panel 25 may be used to select 3, 6, 9 or 12 volts as the output voltage. A display portion of the panel 25 indicates the charge remaining in the battery on a scale from full to empty.

Using the smart battery of the present invention, an on-board battery control system is realized that monitors and controls the discharge and recharge of the battery and provides the user with status information. Intelligence gained from exhaustive characterization of the battery during testing may be built into the device. The control system accepts configuring commands and is user programmable to customize the control system for a particular application. Input and output information may be displayed directly on the module.

The foregoing has described the principles, preferred embodiments and modes of operation of the present invention. However, the present invention should not be construed as being limited to the particular embodiments disclosed, and the embodiments described herein are to be regarded as illustrative rather than restrictive. Variations and changes may be made in the illustrated embodiments without departing from the spirit of the present invention as defined by the following claims.

What is claimed is:

1. A configurable battery comprising:

a plurality of battery cells;

means for switchably connecting said plurality of battery cells in series according to one switching condition and in parallel according to another switching condition;

a microprocessor powered by at least one of said battery cells, responsive to electrical signals for causing said one switching condition and for causing said another switching condition;

a unitary housing inside of which said battery cells, said means for switchably connecting, and said control means are all disposed; and means for communicating electrical signals representing a desired voltage from an exterior of said housing to said microprocessor.

2. The apparatus of claim 1 further comprising display means visibly mounted on said exterior of said housing and responsive to said microprocessor for displaying a nominal voltage of said battery cells as connected.

3. An apparatus comprising:

a battery;

means for storing a multiplicity of data points representing one of an expected charging characteristic and an expected discharging characteristic of said battery;

means for monitoring a state of charge said battery and producing an indication of said state of charge;

means for comparing over time said indication of the state of charge of the battery with ones of said multiplicity of data points; and housing means for housing said battery, said means for storing, said means for monitoring and said means for comparing.

4. The apparatus of claim 3 further comprising:

means for switchably connecting said battery to terminals external to said housing means; and control means responsive to said means for comparing for causing said battery to be disconnected from said terminals.

5. The apparatus of claim 3 further comprising:

means responsive to said means for comparing for producing a digital signal indicative of an abnormal condition; and means for communicating said digital signal to an exterior of said housing means.

6. An apparatus comprising:

a battery;

means for storing a multiplicity of data points representing an expected state of charge of said battery over a multiplicity of charging cycles;

means for monitoring a state of charge of said battery and producing an indication of said state of charge of;

means for comparing over multiple cycles said indication of the state of charge of the battery with ones of said multiplicity of data points; and housing means for housing said battery, said means for storing, said means for monitoring and said means for comparing.

7. The apparatus of claim 6 further comprising:

means for switchably connecting said battery to terminals external to said housing means; and control means responsive to said means for comparing for causing said battery to be disconnected from said terminals.

8. The apparatus of claim 6 further comprising:

means responsive to said means for comparing for producing a digital signal indicative of an abnormal condition; and means for communicating said digital signal to an exterior of said housing means.

* * * * *